United States Patent
Sekine

(10) Patent No.: US 11,846,604 B2
(45) Date of Patent: Dec. 19, 2023

(54) ION SENSING DEVICE

(71) Applicant: TIANMA JAPAN, LTD., Kanagawa (JP)

(72) Inventor: Hiroyuki Sekine, Kanagawa (JP)

(73) Assignee: TIANMA JAPAN, LTD., Kanagawa (JP)

( * ) Notice: Subject to any disclaimer, the term of this patent is extended or adjusted under 35 U.S.C. 154(b) by 325 days.

(21) Appl. No.: 17/099,976

(22) Filed: Nov. 17, 2020

(65) Prior Publication Data

US 2021/0199619 A1    Jul. 1, 2021

(30) Foreign Application Priority Data

Dec. 26, 2019  (JP) ................. 2019-236925

(51) Int. Cl.
*G01N 27/414*  (2006.01)
*H01L 29/786*  (2006.01)

(52) U.S. Cl.
CPC ........ *G01N 27/414* (2013.01); *H01L 29/7869* (2013.01); *H01L 29/78648* (2013.01)

(58) Field of Classification Search
CPC .......... H01L 29/7869; H01L 29/78648; G01N 27/4145; G01N 27/414
See application file for complete search history.

(56) References Cited

U.S. PATENT DOCUMENTS

| | | | |
|---|---|---|---|
| 2004/0132204 A1* | 7/2004 | Chou | G01N 27/4148 436/163 |
| 2005/0221594 A1* | 10/2005 | Chou | H01L 21/02565 438/584 |
| 2005/0230245 A1* | 10/2005 | Morgenshtein | G01N 27/4148 204/416 |
| 2010/0007326 A1* | 1/2010 | Nakazato | G01N 27/4148 324/71.5 |
| 2015/0276663 A1 | 10/2015 | Takechi et al. | |
| 2017/0082570 A1 | 3/2017 | Takechi et al. | |

* cited by examiner

*Primary Examiner* — Alvaro E Fortich
*Assistant Examiner* — Adam S Clarke
(74) *Attorney, Agent, or Firm* — Sughrue Mion, PLLC

(57) ABSTRACT

Ion sensing device includes a field-effect transistor including a bottom gate and a top gate, a reference electrode, and a driver circuit configured to measure concentration of ions in a sample solution into which the reference electrode and the top gate are immersed. The driver circuit includes a constant current source configured to supply a drain of the field-effect transistor with a constant current, and a voltage follower configured to receive a potential of the drain. The driver circuit is configured to supply the reference electrode with a constant reference potential, apply a constant voltage across an output of the voltage follower and the bottom gate, and output an output potential of the voltage follower.

9 Claims, 5 Drawing Sheets

ION SENSING DEVICE

CROSS-REFERENCE TO RELATED APPLICATIONS

This non-provisional application claims priority under 35 U.S.C. § 119(a) on Patent Application No. 2019-236925 filed in Japan on Dec. 26, 2019, the entire content of which is hereby incorporated by reference.

BACKGROUND

This disclosure relates to an ion sensing device.

Ion-sensitive field-effect transistors (ISFETs) are used in the fields of pH measurement and biosensing. An ISFET does not have a gate electrode of a field-effect transistor. In measurement of an ion concentration with an ISFET, a reference electrode is immersed in the sample solution and the gate insulating film of the field-effect transistor is exposed to the sample solution. As a result, an electrical double layer is produced at the interface between the sample solution and the insulating film of the ISFET and the voltage of the electrical double layer changes the potential at the interface of the channel of the ISFET.

A method of evaluating an ion concentration with an ISFET can be summarized as follows:

(1) Immerse the gate insulating film in the sample solution which is also in contact with the reference electrode;
(2) Apply a constant voltage across the source and the drain of the ISFET; and
(3) Change the source potential with respect to the reference potential so that the drain current will be constant.

The voltage across the reference electrode and the gate changes in accordance with the ion concentration of the sample solution. The source potential changes in accordance with the change of the voltage across the reference electrode and the gate. The source potential is the output of the ISFET; the ion concentration of the sample solution can be obtained from the source potential. The theoretical maximum sensitivity of the ISFET is 58.16 mV/mol (T=293.15K), according to the Nernst equation.

Techniques to improve the sensitivity of the ISFET are disclosed in US 2017/0082570 A and US 2015/0276663 A, for example. The driver circuit disclosed in US 2017/0082570A converts the drain current of the transistor to a voltage with a resistor, detects the voltage, and controls the voltage across the bottom gate and the source with a microprocessor so that the drain current will be constant. As a result, the voltage across the bottom gate and the source is obtained as the variation in the top gate voltage in accordance with the ion concentration. The driver circuit disclosed in US 2015/0276663 A is composed of only analog circuit elements and does not include a microprocessor.

SUMMARY

An aspect of this disclosure is an ion sensing device including: a field-effect transistor including a bottom gate and a top gate; a reference electrode; and a driver circuit configured to measure concentration of ions in a sample solution into which the reference electrode and the top gate are immersed. The driver circuit includes: a constant current source configured to supply a drain of the field-effect transistor with a constant current; and a voltage follower configured to receive a potential of the drain. The driver circuit is configured to: supply the reference electrode with a constant reference potential; apply a constant voltage across an output of the voltage follower and the bottom gate; and output an output potential of the voltage follower.

Another aspect of this disclosure is a method of driving a reference electrode and a field-effect transistor including a bottom gate and a top gate in order to measure concentration of ions in a sample solution. The method includes: supplying the drain of the field-effect transistor with a constant current; inputting a potential of the drain to a voltage follower; supplying the reference electrode with a constant reference potential; applying a constant voltage across an output of the voltage follower and the bottom gate; and outputting an output potential of the voltage follower. The method is performed in a state where the reference electrode and the top gate are immersed in the sample solution.

It is to be understood that both the foregoing general description and the following detailed description are exemplary and explanatory and are not restrictive of this disclosure.

EMBODIMENTS

Figure 1:
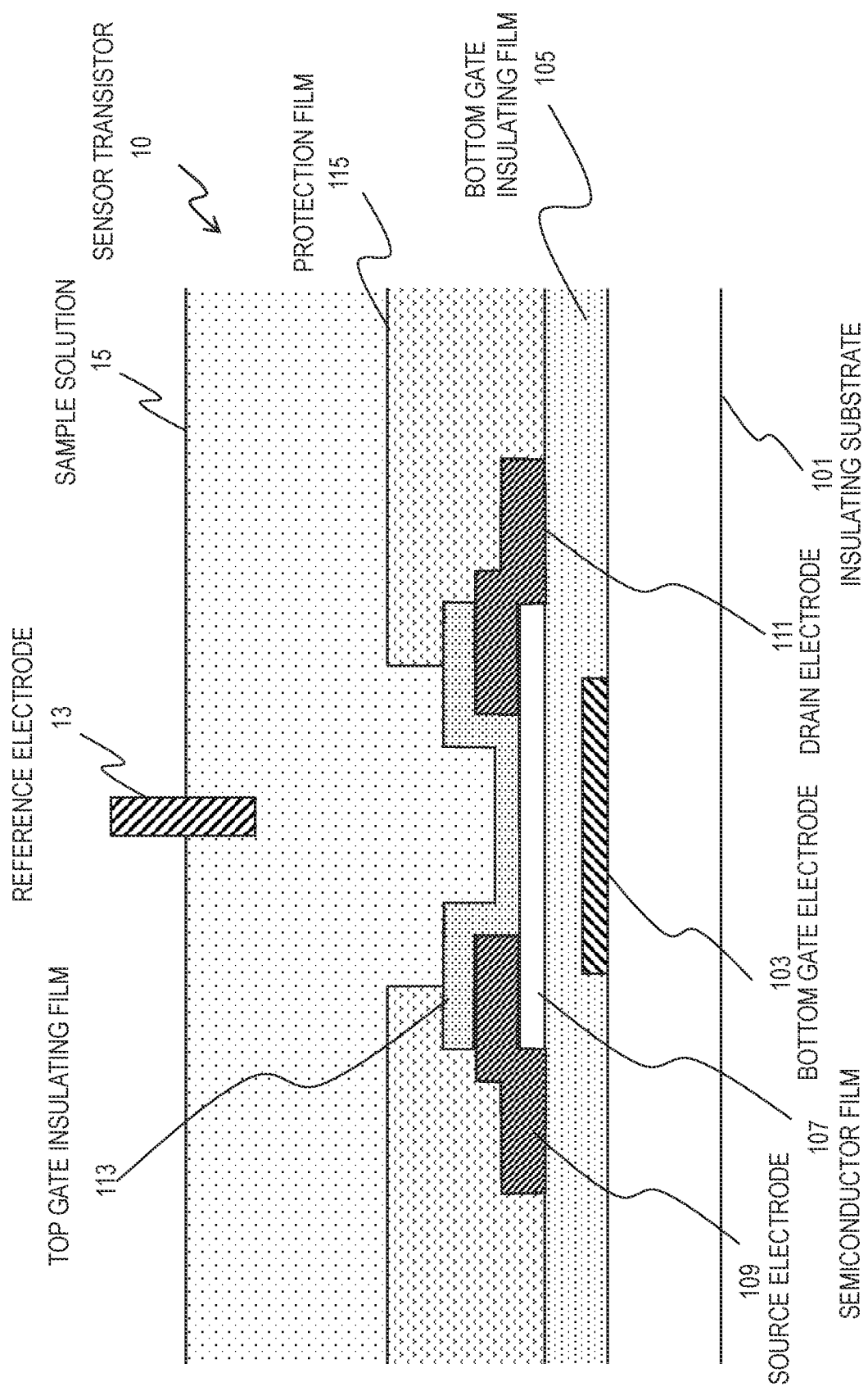
FIG. 1 is a cross-sectional diagram schematically illustrating a configuration example of a sensor transistor included in an ion sensing device in an embodiment of this disclosure.

Hereinafter, embodiments of this disclosure will be described with reference to the accompanying drawings. The embodiments are merely examples to implement the idea of this disclosure and not to limit the technical scope of this disclosure. Elements common to the drawings are denoted by the same reference signs and each element in the drawings may be exaggerated in size or shape for clear understanding of the description.

Hereinafter, a configuration example of an ion sensing device is described. The ion sensing device includes a reference electrode to be immersed in the sample solution, a sensor transistor, and a driver circuit for driving these. The driver circuit supplies a constant reference potential to the reference electrode. The driver circuit supplies a constant current to the drain of the sensor transistor, inputs the potential of the drain of the sensor transistor to a voltage follower, and applies a constant voltage across the output of the voltage follower and the bottom gate. The output of the voltage follower is output as the value representing the ion concentration of the sample solution. This configuration allows the potential of the reference electrode to be fixed and further, increases the accuracy in the output of the driver circuit.

FIG. 1 is a cross-sectional diagram schematically illustrating a configuration example of the sensor transistor included in an ion sensing device in an embodiment of this disclosure. In addition to the sensor transistor 10 illustrated in FIG. 1, the ion sensing device includes a controller (not shown) for measuring an ion concentration with the sensor transistor 10. The controller includes a driver circuit for driving the sensor transistor 10. The details of the driver circuit will be described later.

The configuration example of the sensor transistor 10 in FIG. 1 is a thin film transistor. The sensor transistor 10 includes a bottom gate electrode 103 provided on an insulating substrate 101. The insulating substrate 101 can be made of glass or resin. The bottom gate electrode 103 can be made of an aluminum-based alloy.

A bottom gate insulating film 105 is provided to cover the bottom gate electrode 103 on the insulating substrate 101. The bottom gate insulating film 105 can be a silicon oxide film.

An island-like semiconductor film 107 is provided on the bottom gate insulating film 105. The semiconductor film 107 can be made of an oxide semiconductor. Examples of the oxide semiconductor include amorphous InGaZnO (a-InGaZnO) and microcrystal InGaZnO. Oxide semiconductors such as a-InSnZnO, a-InGaZnSnO, and ZnO can also be used. Oxide semiconductors can provide transistors with better saturation characteristics than the other thin-film semiconductor materials.

A source electrode 109 and a drain electrode 111 are provided in contact with parts of the top face of the semiconductor film 107. The source electrode 109 and the drain electrode 111 can be made of titanium or molybdenum.

A top gate insulating film (ion-sensitive insulating film) 113 is provided to cover and be in contact with the semiconductor film 107 and parts of the source electrode 109 and the drain electrode 111. The top gate insulating film 113 can be made of a high-dielectric material such as aluminum oxide, tantalum oxide, or hafnium oxide.

These high-dielectric materials have relative permittivities higher than that of silicon oxide. Accordingly, the electrostatic capacitance per unit area of the top gate insulating film 113 is higher than the electrostatic capacitance per unit area of the bottom gate insulating film 105.

A protection film 115 is provided to cover the top gate insulating film 113, the source electrode 109, and the drain electrode 111 but expose a part of the top gate insulating film 113. The part of the top gate insulating film 113 over the region corresponding to the channel of the semiconductor film 107 is exposed from the protection film 115. The protection film 115 is made of an insulative material such as epoxy resin.

The sensor transistor 10 having the above-described structure is put in a sample solution 15 together with a reference electrode 13 in such a manner that the top gate insulating film 113 exposed from the protection film 115 is immersed in the sample solution 15. The controller drives the reference electrode 13 and the sensor transistor 10 and measures the ion concentration of the sample solution 15 from the signal obtained from the sensor transistor 10.

FIG. 1 is to illustrate an example of the sensor transistor 10; the ion sensing device in this embodiment can employ a field-effect transistor of any structure (or material). For example, the insulating substrate 101 can be excluded and the bottom gate electrode 103 can be replaced with a silicon substrate. The material of the semiconductor film 107 is not limited to an oxide semiconductor; amorphous silicon, polysilicon, or crystalline silicon can be used.

As described above, the reference electrode 13 and the top gate insulating film (ion-sensitive insulating film) 113 of the sensor transistor 10 are exposed to the sample solution 15. An electrical double layer is produced at the interface between the sample solution 15 and the top gate insulating film 113 and the voltage of the electrical double layer changes the potential at the interface of the channel of the sensor transistor. The electrical double layer depends on the concentration of ions in the sample solution 15. Accordingly, the concentration of ions in the sample solution 15 can be measured by reading the signal from the sensor transistor 10.

Figure 2:
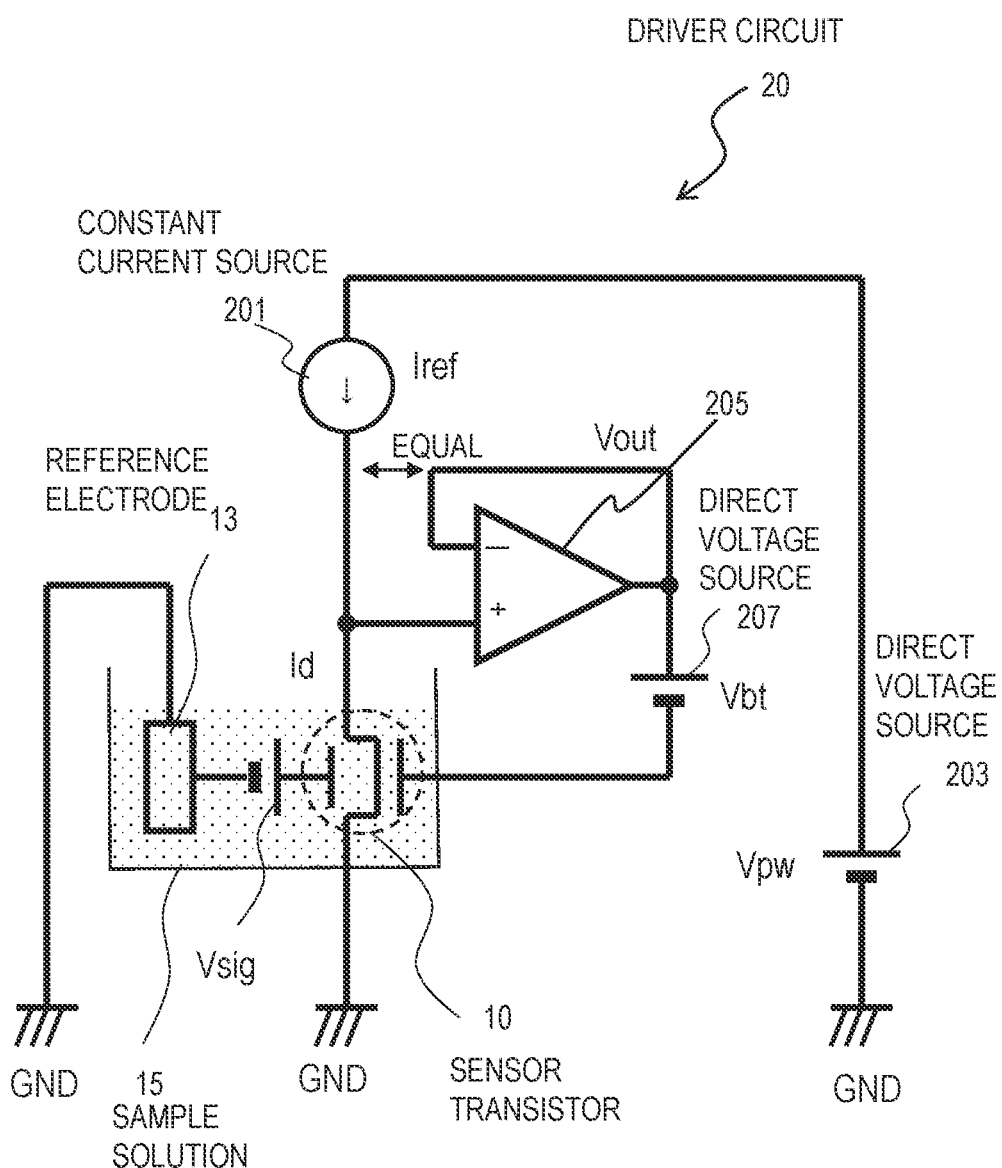
FIG. 2 illustrates a configuration example of a driver circuit included in a controller.

Hereinafter, a method of measuring an ion concentration with the reference electrode 13 and the sensor transistor 10. FIG. 2 illustrates a configuration example of a driver circuit 20 included in the controller. The driver circuit 20 supplies the reference electrode 13 with a reference potential. The reference potential in the configuration example in FIG. 2 is the ground potential (GND). A voltage Vsig is generated across the reference electrode 13 and the top gate of the sensor transistor 10 in accordance with the ion concentration of the sample solution 15.

The driver circuit 20 includes a constant current source 201 connected with the drain of the sensor transistor 10 and a constant voltage source 203 for supplying the constant current source 201 with a constant voltage Vpw with respect to a reference potential. The driver circuit 20 supplies the drain of the sensor transistor 10 with a constant current Iref. The drain current Id of the sensor transistor 10 is equal to the constant current Iref.

The reference potential in the configuration example in FIG. 2 is the ground potential (GND) and the constant current source 201 is maintained at a constant potential with respect to the reference potential. The source of the sensor transistor 10 is maintained at a constant reference potential. This reference potential in the configuration example in FIG. 2 is the ground potential.

The driver circuit 20 further includes an operational amplifier 205. The operational amplifier 205 is configured as a voltage follower. The potential of a node between the constant current source 201 and the drain of the sensor transistor 10 is input to the non-inverting input (+) of the operational amplifier 205. The output of the operational amplifier 205 is connected with the inverting input (−) to apply negative feedback to the operational amplifier 205.

The driver circuit 20 further includes a constant voltage source 207 between the output of the operational amplifier 205 and the bottom gate of the sensor transistor 10. The constant voltage source 207 supplies the bottom gate of the sensor transistor 10 with a potential different from the output of the operational amplifier 205 by a constant voltage Vbt. Although all reference potentials in the configuration example in FIG. 2 are the ground potential, they can be at different values as far as individual reference potentials are constant.

Operation of the driver circuit 20 is described. The voltage Vtgs across the top gate and the source of the sensor transistor 10 takes a value in accordance with the ion concentration of the sample solution 15. Accordingly, the ion concentration of the sample solution 15 can be measured by measuring the top gate voltage Vtgs with respect to the source potential.

The voltage across the drain and the source of the sensor transistor 10 (the drain potential with respect to the source potential) Vds and the voltage across the back gate and the source of the sensor transistor 10 (the back gate potential with respect to the source potential) Vbgs are expressed as follows:

$$Vds = Vout \qquad (1)$$

$$Vbgs = Vout - Vbt \qquad (2)$$

where Vout represents the voltage across the output of the operational amplifier 205 and the source of the sensor transistor 10 (the output potential of the operational amplifier 205 with respect to the source potential).

Since negative feedback is applied to the operational amplifier 205, the potential difference between the inverting input and the non-inverting input is zero. Accordingly, the drain potential Vds of the sensor transistor 10 is equal to the output potential Vout of the operational amplifier 205. Meanwhile, the constant voltage source 207 supplies the back gate of the sensor transistor 10 with a potential lower than the output potential of the operational amplifier 205 by a voltage Vbt.

The drain current Id of the sensor transistor 10 can be expressed by a predetermined function f:

$$Id=f(Vbgs-(ctg/cbg)Vtgs, Vds) \quad (3)$$

where ctg represents the electrostatic capacitance per unit area of the top gate insulating film and cbg represents the electrostatic capacitance per unit area of the bottom gate insulating film. When the electrostatic capacitance per unit area of the top gate insulating film is larger than the electrostatic capacitance per unit area of the bottom gate insulating film as described above, the sensor transistor 10 can have high sensitivity.

The driver circuit 20 limits the drain current Id of the sensor transistor 10 to the constant current Iref with the constant current source 201. Although the voltage Vds across the drain and the source of the sensor transistor 10 could vary as described above, when the saturation characteristic of the transistor is good and the transistor is operating with the saturation characteristic, the drain current Id highly depends on the back gate potential Vbgs and the top gate potential Vtgs, compared to the drain potential Vds. Accordingly, Vds in the formula (3) can be ignored. Further, since Ids is kept constant by the current source in the driver circuit 20, the following relation is established:

$$Vbgs-(Ctg/Cbg)Vtgs=\text{Constant Value} \quad (4)$$

As noted from the formula (2), the back gate potential Vbgs is expressed by a linear expression of the output potential Vout of the operational amplifier 205. Accordingly, the output potential Vout of the operational amplifier 205 can be expressed by a linear expression of the top gate potential Vtgs. Since the top gate potential Vtgs takes a value in accordance with the ion concentration of the sample solution 15, the output potential Vout of the operational amplifier 205 represents the ion concentration of the sample solution 15. The controller can determine the ion concentration from the output potential Vout of the operational amplifier 205 in accordance with a predetermined function. The controller displays the measured ion concentration on a display device.

In an example, the driver circuit 20 operates the sensor transistor 10 in the saturation region. This operation lowers the dependency of the drain current Id on the drain-source voltage Vds more. As a result, the top gate potential Vtgs can be measured more accurately.

As described above, the driver circuit 20 does not include a microprocessor but is composed of only analog circuit elements. For this reason, no circuit element for analog-to-digital conversion is necessary, unlike the configuration including a microprocessor. Therefore, the factors to degrade the measurement accuracy can be minimized. Further, the potential of the reference electrode 13 can be fixed at a desirable reference potential; the potential of the sample solution 15 does not change during the measurement. For this reason, concentrations of a plurality of kinds of ions in the sample solution 15 can be measured concurrently with one reference electrode 13 and a plurality of sensor transistors.

Figure 3:
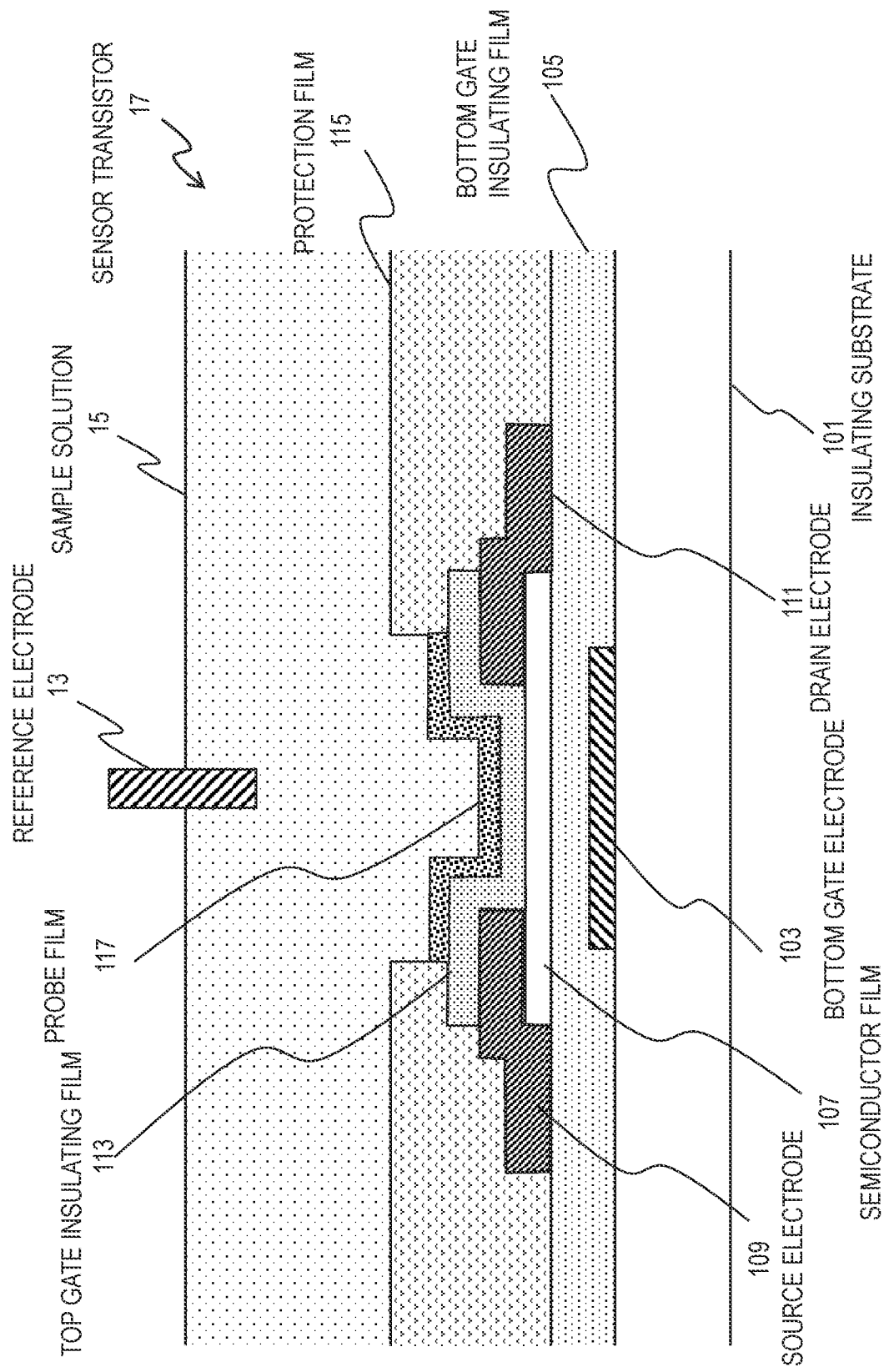
FIG. 3 illustrates a configuration example of a sensor transistor for selectively measuring the concentration of a specific kind of ions.

Hereinafter, an example of an ion sensing device for selectively measuring the concentration of ions of a specific substance in a sample solution 15 is described. FIG. 3 illustrates a configuration example of a sensor transistor 17 for selectively measuring the concentration of a specific kind of ions. Differences from the sensor transistor 10 illustrated in FIG. 1 are mainly described.

The sensor transistor 17 includes a probe film 117 on a top gate insulating film 113 to cover the exposed part of the top gate insulating film 113, in addition to the configuration of the sensor transistor 10 illustrated in FIG. 1. The probe film 117 can be an ion-selective film that interacts with a specific kind of ions (for example, absorbs the ions) or an organic film (such as an enzyme film or an antibody film) that interacts with a specific substance (for example, absorbs the substance) and raises the concentration of a specific kind of ions.

For example, a specific enzyme film raises the concentration of a specific kind of ions within the film by enzymic reaction to a specific substance. The sensor transistor 17 can obtain an electric signal proportional to the concentration of the specific substance.

As understood from the above, the sensor transistor 17 can be used to selectively measure an ion concentration in accordance with the concentration of a specific substance (including ions) in a sample solution 15. The configuration example illustrated in FIG. 1 can also be used to selectively measure the concentration of a specific kind of ions by forming the top gate insulating film 113 of a specific material. Such sensing devices can be used in various fields such as biotechnology and medicine.

Figure 4:
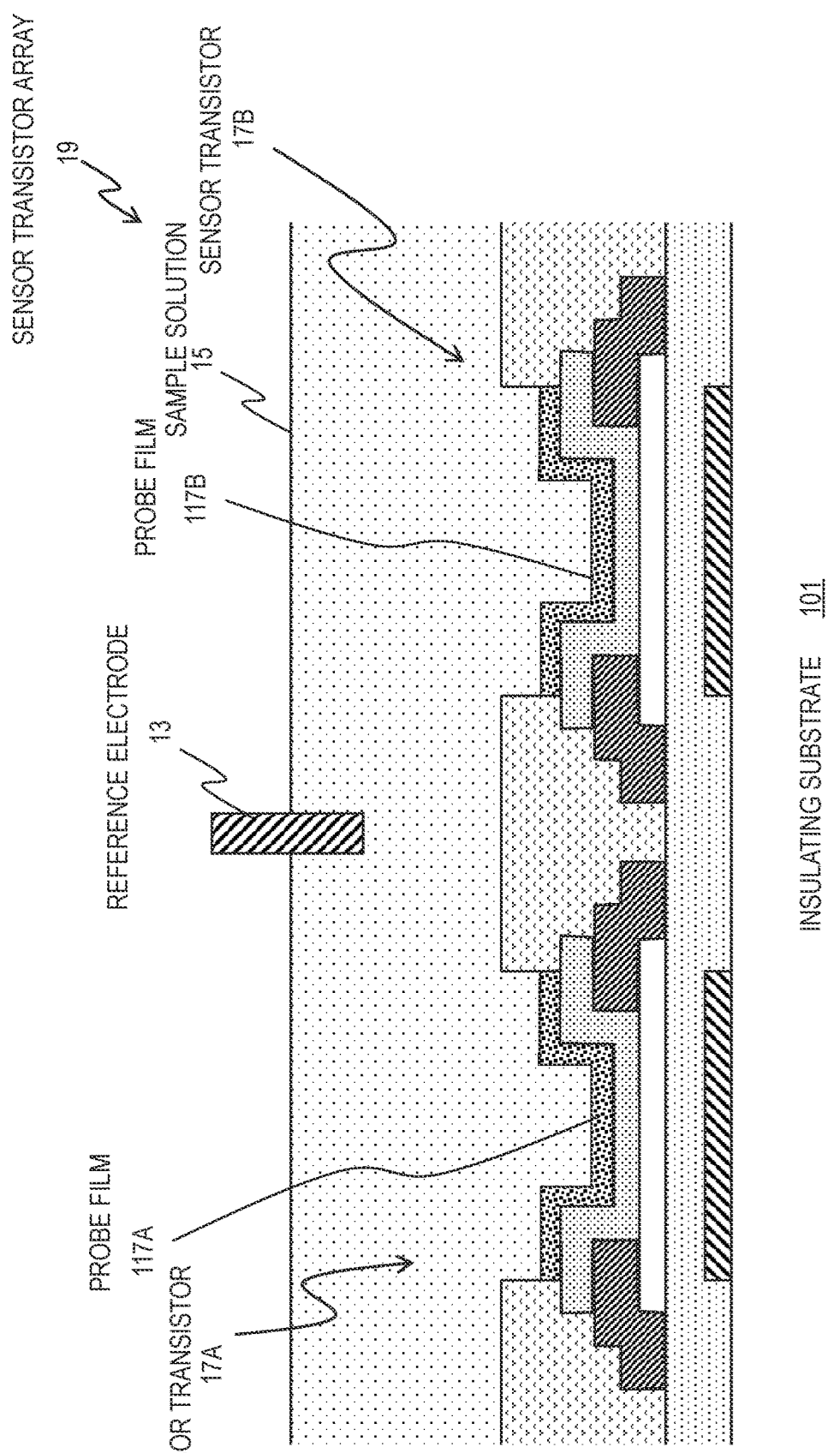
FIG. 4 schematically illustrates a configuration example of a sensor transistor array included in an ion sensing device.

FIG. 4 schematically illustrates a configuration example of a sensor transistor array 19 included in an ion sensing device. The sensor transistor array 19 includes a plurality of sensor transistors arrayed on a substrate. FIG. 4 illustrates two sensor transistors 17A and 17B by way or example. The structures of the sensor transistors 17A and 17B are the same as the structure of the sensor transistor 17 illustrated in FIG. 3 and therefore, reference signs of some elements are omitted in FIG. 4.

The sensor transistors 17A and 17B include probe films 117A and 117B, respectively, that interact with different substances. The sensor transistors 17A and 17B enable measurement of concentrations of different substances in a sample solution 15. An array driver circuit in this embodiment allows the reference electrode 13 to be used commonly to the sensor transistors 17A and 17B.

Figure 5:
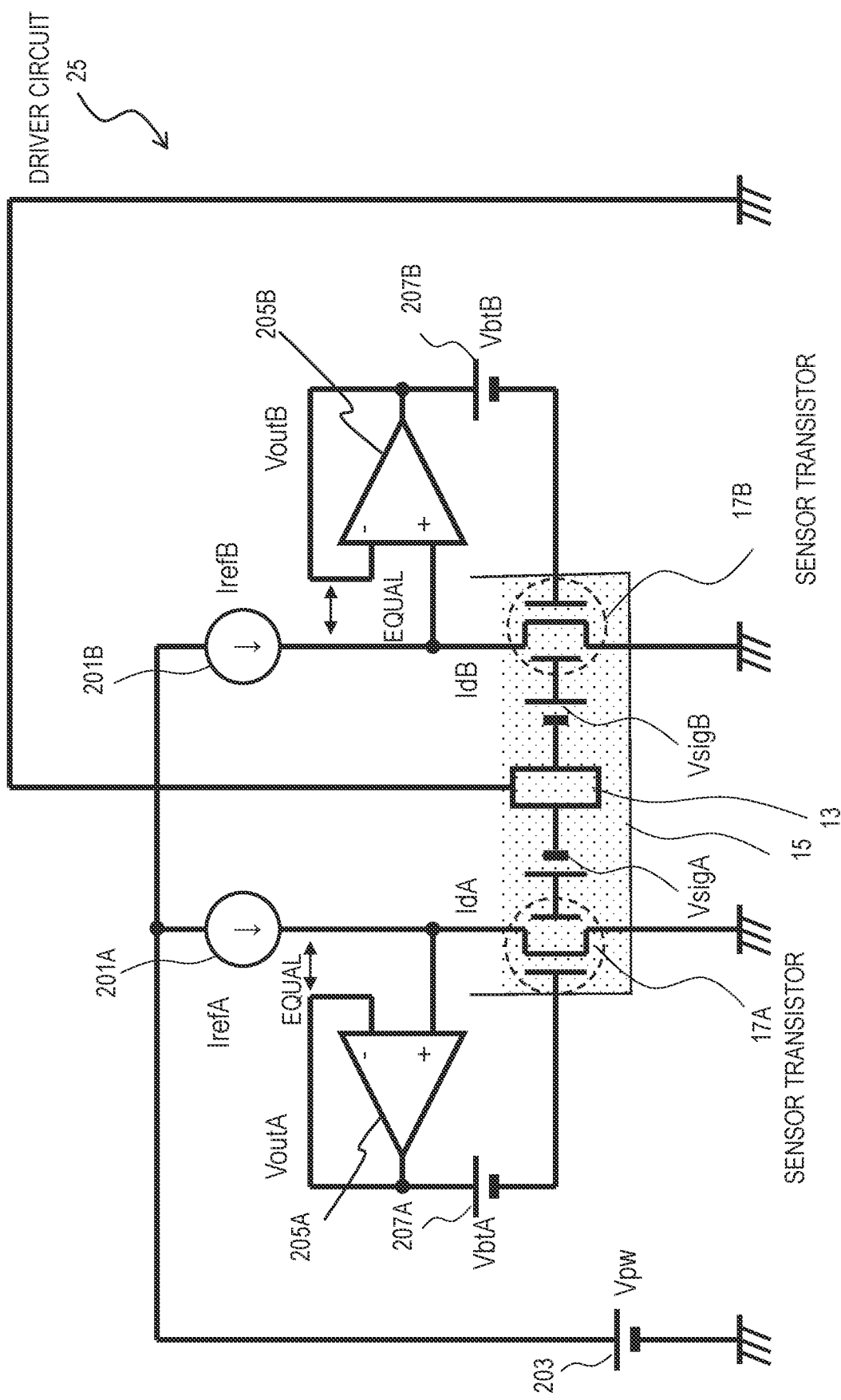
FIG. 5 illustrates a configuration example of an array driver circuit for driving the sensor transistors in FIG. 4.

FIG. 5 illustrates a configuration example of an array driver circuit 25 for driving the sensor transistors 17A and 17B illustrated in FIG. 4. The array driver circuit 25 includes transistor driver circuits for the sensor transistors 17A and 17B in one-to-one correspondence. Each transistor driver circuit has the same configuration as the driver circuit described with reference to FIG. 2.

Specifically, FIG. 5 shows that a voltage VsigA is generated across the reference electrode 13 and the top gate of the sensor transistor 17A in accordance with the concentration of ions of a specific substance in the sample solution 15. The array driver circuit 25 includes a constant current source 201A connected with the drain of the sensor transistor 17A and a constant voltage source 203 for supplying the constant current source 201A with a constant voltage Vpw with respect to a reference potential. The array driver circuit 25 supplies the drain of the sensor transistor 17A with a constant current IrefA. The drain current IdA of the sensor transistor 17A is equal to the constant current IrefA. The constant current source 201A is maintained at a constant potential with respect to the reference potential. The source of the sensor transistor 17A is maintained at a constant reference potential.

The array driver circuit 25 further includes an operational amplifier 205A. The operational amplifier 205A is configured as a voltage follower. The potential of a node between the constant current source 201A and the drain of the sensor transistor 17A is input to the non-inverting input (+) of the operational amplifier 205A. The output of the operational amplifier 205A is connected with the inverting input (−) to apply negative feedback to the operational amplifier 205A.

The array driver circuit 25 further includes a constant voltage source 207A between the output of the operational amplifier 205A and the bottom gate of the sensor transistor 17A. The constant voltage source 207A supplies the bottom gate of the sensor transistor 17A with a potential different from the output of the operational amplifier 205A by a constant voltage VbtA.

Meanwhile, a voltage VsigB is generated across the reference electrode 13 and the top gate of the sensor transistor 17B in accordance with the concentration on ions of another specific substance in the sample solution 15. The constant voltage source 203 supplies the constant current source 201B connected with the drain of the sensor transistor 17B with the constant voltage Vpw with respect to the reference potential. The array driver circuit 25 supplies the drain of the sensor transistor 17B with a constant current IrefB. The drain current IdB of the sensor transistor 17B is equal to the constant current IrefB. The constant current source 201B is maintained at a constant potential with respect to the reference potential. The source of the sensor transistor 17B is maintained at a constant reference potential.

The array driver circuit 25 further includes an operational amplifier 205B. The operational amplifier 205B is configured as a voltage follower. The potential of a node between the constant current source 201B and the drain of the sensor transistor 17B is input to the non-inverting input (+) of the operational amplifier 205B. The output of the operational amplifier 205B is connected with the inverting input (−) to apply negative feedback to the operational amplifier 205B.

The array driver circuit 25 further includes a constant voltage source 207B between the output of the operational amplifier 205B and the bottom gate of the sensor transistor 17B. The constant voltage source 207B supplies the bottom gate of the sensor transistor 17B with a potential different from the output of the operational amplifier 205B by a constant voltage VbtB.

The operation of the circuits for driving the sensor transistors 17A and 17B is the same as the operation of the driver circuit 20 described with reference to FIG. 2 and therefore, the description is omitted here. The array driver circuit 25 includes the same driver circuits for the other sensor transistors. Although all reference potentials in the configuration example in FIG. 5 are the ground potential, they can be at different values as far as individual reference potentials are constant.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An ion sensing device comprising:
   a plurality of field-effect transistors, each including a bottom gate and a top gate;
   a reference electrode; and
   a driver circuit configured to measure concentration of ions in a sample solution into which the reference electrode and the top gate of an associated field-effect transistor, from among the plurality of field-effect transistors, are immersed,
   wherein each of the plurality of field-effect transistors includes a probe film attached on the top gate, the probe film having a characteristic that interacts with a different substance in the sample solution,
   wherein the driver circuit includes circuits associated with the plurality of field-effect transistors in one-to-one correspondence, and
   wherein the driver circuit includes circuits associated with the plurality of field-effect transistors in one-to-one correspondence,
   wherein each associated circuit includes:
      an associated constant current source configured to supply a drain of the associated field-effect transistor with a constant current; and
      an associated voltage follower configured to receive a potential of the drain of the associated field-effect transistor, and
   wherein the driver circuit is configured to:
      supply the reference electrode with a constant reference potential;
      apply a constant voltage across an output of the associated voltage follower and the bottom gate of the associated field-effect transistor; and
      output an output potential of the associated voltage follower.

2. The ion sensing device according to claim 1, wherein the driver circuit is configured to operate at least one of the plurality of field-effect transistors in a saturation region.

3. The ion sensing device according to claim 1, wherein electrostatic capacitance per unit area of an insulating film for the top gate of at least one of the plurality of field-effect transistors is larger than electrostatic capacitance per unit area of an insulating film for the bottom gate of the at least one of the plurality of field-effect transistors.

4. The ion sensing device according to claim 1, wherein at least one of the plurality of the plurality of field-effect transistors is an oxide semiconductor thin-film transistor.

5. The ion sensing device according to claim 1, wherein the reference electrode is directly connected to a direct voltage source configured to provide the constant reference potential.

6. A method of driving a reference electrode and a plurality of field-effect transistors, each including a bottom gate and a top gate, in order to measure concentration of ions in a sample solution, wherein each of the plurality of field-effect transistors includes a probe film attached on the top gate, and the probe film has a characteristic that interacts with a different substance, the method comprising:
   supplying drains of the plurality of field-effect transistors with constant currents;
   inputting potentials of the drains of the plurality of field-effect transistors to different voltage followers;
   supplying the reference electrode with a constant reference potential;

applying constant voltages across outputs of the different voltage followers and the bottom gates of the plurality of field-effect transistors; and outputting output potentials of the different voltage followers, wherein the method is performed in a state where the reference electrode and the top gates of the plurality of field-effect transistors are immersed in the sample solution.

7. The method according to claim 6, further comprising:
operating at least one of the plurality of field-effect transistors in a saturation region.

8. The method according to claim 6, wherein electrostatic capacitance per unit area of an insulating film for the top gate of at least one of the plurality of field-effect transistors is larger than electrostatic capacitance per unit area of an insulating film for the bottom gate of the at least one of the plurality of field-effect transistors.

9. The method according to claim 6, wherein the reference electrode is directly connected to a direct voltage source providing the constant reference potential.

\* \* \* \* \*